United States Patent [19]

Saito

[11] Patent Number: 5,753,533
[45] Date of Patent: May 19, 1998

[54] METHOD FOR ETCHING A TUNGSTEN FILM

[75] Inventor: Kazumi Saito, Tokyo, Japan

[73] Assignee: NEC Corporation, Japan

[21] Appl. No.: 663,599

[22] Filed: Jun. 14, 1996

Related U.S. Application Data

[63] Continuation of Ser. No. 345,839, Nov. 28, 1994, abandoned.

[30] Foreign Application Priority Data

Nov. 26, 1993 [JP] Japan ................................ 5-296495

[51] Int. Cl.⁶ ............................................ H01L 21/28
[52] U.S. Cl. ........................... 437/192; 437/190; 437/246; 156/646.1; 156/656.1
[58] Field of Search ................................ 437/190, 192, 437/245, 246, 228; 156/643.1, 646.1, 656.1

[56] References Cited

U.S. PATENT DOCUMENTS

| | | | |
|---|---|---|---|
| 4,948,462 | 8/1990 | Rossen | 156/643 |
| 5,024,722 | 6/1991 | Cathey, Jr. | 156/643 |
| 5,273,609 | 12/1993 | Moslehi | 156/643 |
| 5,347,696 | 9/1994 | Willer et al. | 156/646 |
| 5,376,585 | 12/1994 | Lin et al. | 437/192 |
| 5,378,309 | 1/1995 | Rabinzohn | 156/643 |

FOREIGN PATENT DOCUMENTS

| | | | |
|---|---|---|---|
| 234920 | 2/1990 | Japan | H01L 21/302 |
| 3201529 | 3/1991 | Japan | H01L 21/302 |

*Primary Examiner*—John Niebling
*Assistant Examiner*—Thomas G. Bilodeau
*Attorney, Agent, or Firm*—Hayes, Soloway, Hennessey, Grossman & Hage, P.C.

[57] ABSTRACT

The invention provide a method for manufacturing a wire by etching a metallic film involving a high melting point metal without side etching. When a tungsten film 4c is etched by a mixed gas involving $SF_6$ and $N_2$, tungsten nitride films 14 are formed on side walls of an tungsten film 4c being etched, and said tungsten nitride films 14 serve as protector against etching. The selected figure is FIG. 5.

1 Claim, 4 Drawing Sheets

(BEFORE ETCHING)

(FLOW OF $N_2$ = 0 sccm)

(FLOW OF $N_2$ = 10 sccm)

(FLOW OF $N_2$ = 40 sccm)

(FLOW OF $N_2$ = 70 sccm)

METHOD FOR ETCHING A TUNGSTEN FILM

This is a continuation of application Ser. No. 08/345,839 filed on Nov. 28, 1994, now abandoned.

FIELD OF THE INVENTION

The invention relates to a method for manufacturing of a semiconductor device, and especially to an etching process of a metallic film involving a high melting point metal.

BACKGROUND OF THE INVENTION

As a method of increasing density of integration of semiconductor devices, multi-layer wirings are used in many cases. Excepting the highest layer, in intermediate layers and the lowest one, heat resistant property of wiring is very important, especially in cases of heat treatments for flattening insulator films between layers. Moreover, in wiring in each layer, it is required that, wires have the lowest possible resistances without increasing widths of wires. Accordingly as a metal used in wires in each layer, a metal with high melting point and low specific resistance, such as tungsten, is widely used. Speaking in detail, a wire is consisted of a single layer film of a high melting point metal or alloy, or a multi-layer metallic film involving a high melting point metallic or alloy film. Moreover, in order to manufacture a wire with a narrow width and a high aspect ratio, it is necessary to process a metallic film involving a high melting point metal minutely by anisotropic etching, such as reactive ion etching (RIE, hereinafter). As an etching gas for metals with high melting point, a fluoride gas, such as $CF_4$ or $SF_6$ has been conventionally used.

However, in anisotropic etching of a metallic film involving a high melting point metal by RIE using a fluoride gas, side etching of said metallic film arises right under an etching mask such as a resist film. In this etching reaction, anisotropic reaction is dominant, which is promoted by ion-assist of fluorine ions produced from a fluoride gas, however, isotropic etching caused by chemical reaction between fluoric radicals, dissociated from a fluoride gas, and a high melting point metal arises at a certain rate. Accordingly, side walls of wires obtained by this etching are not perpendicular, widths of wires are narrower than desired ones, and electric resistances of wires become larger and vary widely.

Various methods to suppress aforementioned side etching have been proposed. In a method disclosed in Japanese Patent Kokai No.2-34920, a chloride gas is annexed to a fluoride gas. For example, when a metallic film with high melting point is made of tungsten in that method, side walls of a tungsten film being etched are covered with tungsten chloride (W Clx) with low vapor pressure and protected from chemical reaction between fluoric radicals and tungsten. In a method disclosed in Japanese Patent Kokai No.3-201529, a mixed gas involving $CHF_3$ sand $SF_6$ is used as an etching gas. In this method, side walls are protected by polymers produced by $CHF_3$. In these method, however, undesirable influences arise in a process of removing resist films after etching, because side walls are protected by deposits such as chlorides or polymers.

SUMMARY OF THE INVENTION

Accordingly, it is an object of the invention to provide a method for manufacturing a semiconductor device, by which wires having desired forms of side walls, widths and electric resistances can be formed by etching a metallic film involving a high melting point metal, and resist films can be easily removed after etching is over, in a case that an insulator film under a metallic film is flat.

It is a further object of the invention to provide a method for manufacturing a semiconductor device, by which wires having desired forms of side walls, widths and electric resistances can be formed by etching a metallic film involving a high melting point metal, and resist films can be easily removed after etching is over, in a case that an insulator film under a metallic film has a step.

According to the first feature of the invention, a method for manufacturing a semiconductor device comprises the steps of:

forming an insulator film on a surface of a semiconductor, forming a metallic film involving a high melting point metal as a main component on a surface of the insulator film, and forming a resist film with a predetermined pattern on a surface of the metallic film, etching the metallic film by a mixed gas involving a fluoride gas and a nitrogen or ammonia gas, using the resist film as a mask.

According to the second feature of the invention, a method for manufacturing a semiconductor device comprises the steps of:

forming an insulator film on a surface of a semiconductor, forming a metallic film involving a high melting point metal as a main component on a surface of the insulator film, and forming a resist film with a predetermined pattern on a surface of the metallic film, etching the metallic film by a mixed gas involving a first gas composed of a fluoride gas and a second gas composed of a nitrogen or ammonia gas and having a predetermined flow ratio of the first and second gases, by using the resist film as a mask, and over-etching remained metal by a mixed gas involving the first and second gases with increased flow ratio of the first and second gases compared with the predetermined flow ratio.

BRIEF DESCRIPTION OF THE DRAWINGS

The invention will be explained in more detail in conjunction with appended drawings, wherein.

DESCRIPTION OF THE PREFERRED EMBODIMENTS

Figure 1A:
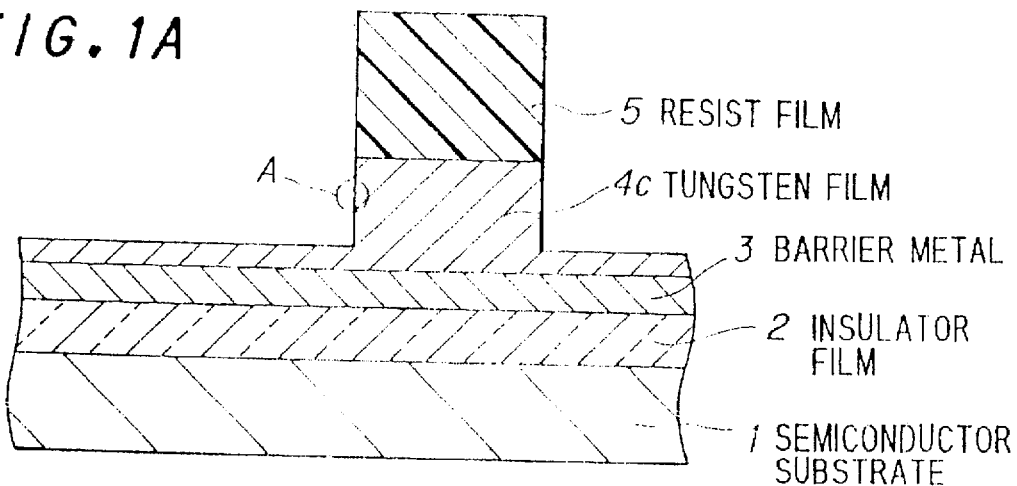
FIGS. 1A to 1C are drawings for explaining the mechanism of the invention schematically, selecting a case of a tungsten film as an example.
Figure 1B:
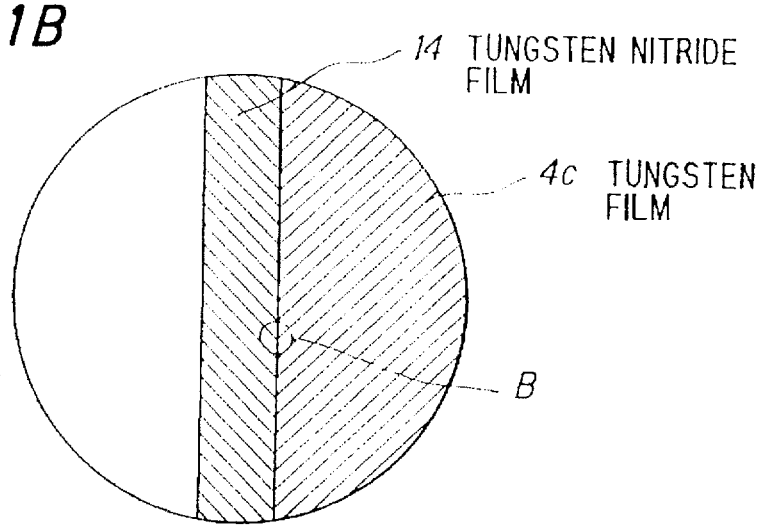
Figure 1C:
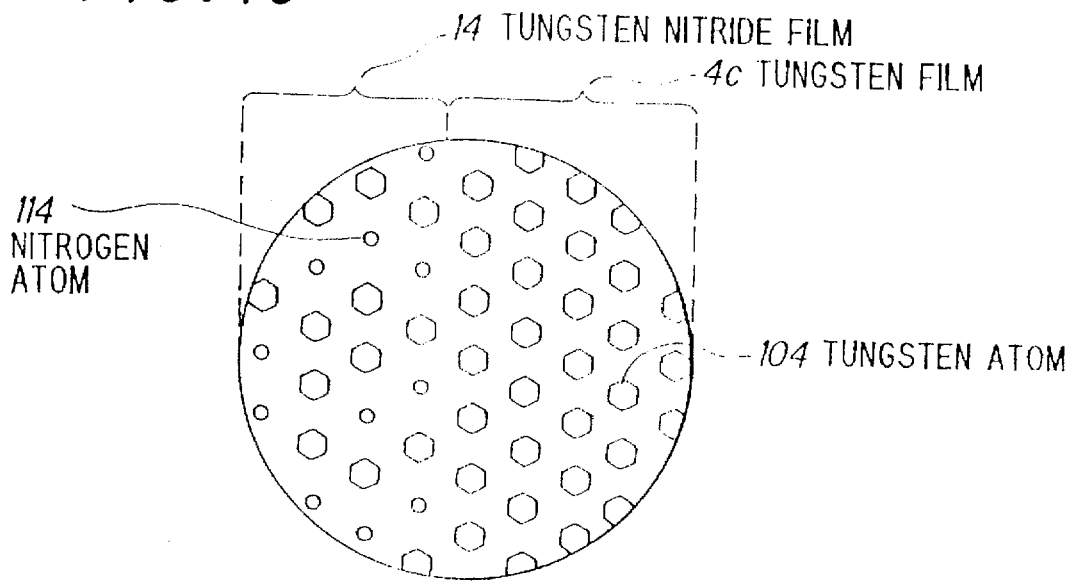

Before describing a method for manufacturing of a semiconductor device in the preferred embodiments according to the invention, the mechanism of the invention will be explained, by which side walls of wires are etched into desired forms with excellent controllability, selecting a case that wires are made of tungsten as an example, and referring to FIG. 1A showing a cross-sectional view of a semiconductor device, FIG. 1B showing a magnified cross-sectional view of the portion A in FIG. 1A, and FIG. 1C showing a magnified cross-sectional view of the portion B in FIG. 1B.

On a semiconductor substrate 1, a surface of which is covered with a insulator film 2, a barrier metal film 3 and a tungsten film 4c are deposited. The tungsten film 4c is etched by a mixed gas involving a fluoride gas and a nitrogen or ammonia gas, wherein a resist film 5 serves as an etching mask. Etching of a tungsten film 4c progresses by chemical reaction between fluoric radicals dissociated from a fluoride gas and fluorine ions as shown in FIG. 1A. Etching by fluoric radicals is isotropic one, and etching by fluorine ions is anisotropic one by ion-assist. In aforementioned mixed gases, nitric radicals are dissociated from a nitrogen or ammonia gas during process of etching. Nitric radicals react with tungsten on a surface of tungsten film 4c being etched, on which a tungsten nitride film 14 is formed as shown in FIG. 1B. A tungsten nitride film 14 is an interstitial compound, in which nitrogen atoms 114S come into crystal lattice consisted of tungsten atoms 104S as shown in FIG. 1C.

Since vapor pressure of tungsten nitride is low, a tungsten nitride film 14 is not eliminated from a surface of a tungsten film 4c, but protects it. Side wall protection by a tungsten nitride film 14 is different in principle from those by other deposit films in conventional technologies. Depositions have no undesirable influence on removability of a resist film 5 caused by adhesion of depositions to a resist film, and a resist film can be easily removed after etching.

Aforementioned tungsten nitride film 14 is formed not only on etching surfaces of side walls of a tungsten film 4c, but also on an etching surface spreading in parallel with a semiconductor substrate 1. On an etching surface of a tungsten film 4c which is not covered with a resist film 5, anisotropic etching progresses in vertical direction to a semiconductor substrate 1 by ion-assist of fluorine ions, and a formed tungsten nitride film 14 and a tungsten film 4c are etched in this portion. In this anisotropic etching by ion-assist of fluorine ions, an etching surface of a tungsten film 4c covered by a resist film 5 is not etched. By using these mechanisms and selecting gas pressure, electric power and respective flow ratios of mixed gases (mentioned later in detail), it becomes possible to make side walls of a remained tungsten film 4c be etched such that side walls are nearly vertical. On these side walls, reaction between fluoric radicals and tungsten is dominant, and therefore a tungsten nitride film 14 is formed and remained.

Figure 2:
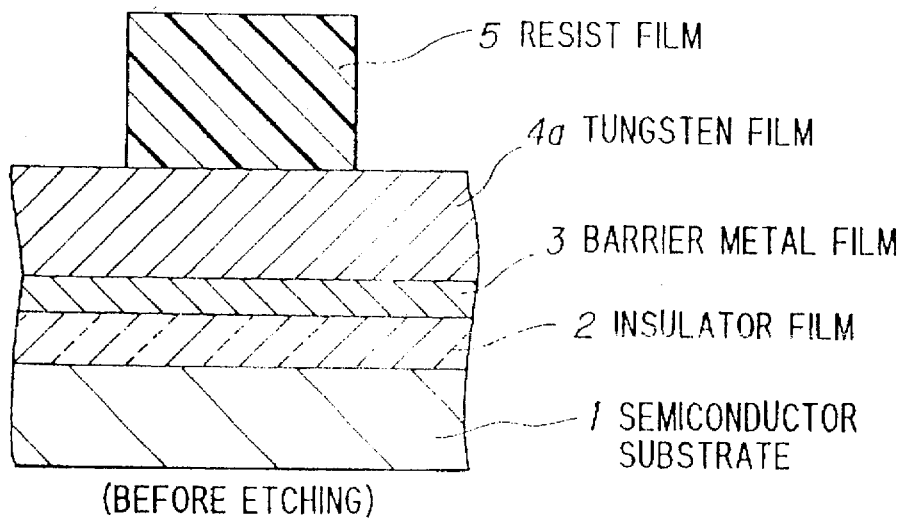
FIG. 2 is a cross-sectional view of a semiconductor device for explaining a first preferred embodiment of the invention.

Next, the invention will be explained referring to appended drawings. Referring to FIG. 2, it can be seen that a fabricating process of a sample for explaining the first preferred embodiment of the invention is as follows. First of all, a barrier metal film 3 of a depth of about 160 nm is deposited by spattering on a surface of an insulator film 2 which covers a semiconductor substrate 1. Still more, a tungsten film 4a of a thickness of about 300 nm is deposited on said barrier metal 3, and a resist film 5 with a predetermined pattern is formed on said tungsten film 4a.

In this embodiment, etching is performed by using a RIE apparatus of parallel plate type with a cathode coupling mean and an exciting frequency of 13.56 MHz, and on the condition that an etching gas is a mixed gas involving $SF_6$ (a fluoride gas) and $N_2$, electric power is 120 W and pressure of an etching gas is about 8.7 Pa.

Figure 3A:
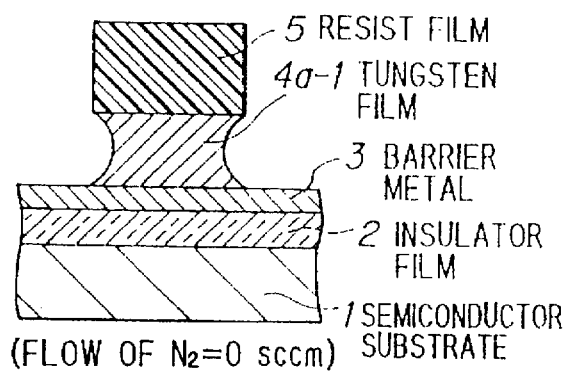
FIGS. 3A to 3D are cross-sectional views of a semiconductor device for explaining a first preferred embodiment of the invention.
Figure 3B:
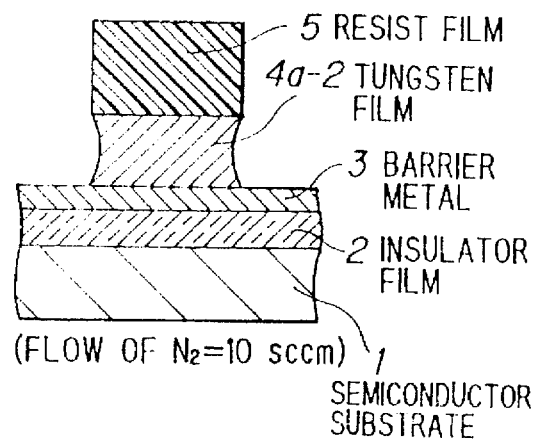
Figure 3C:
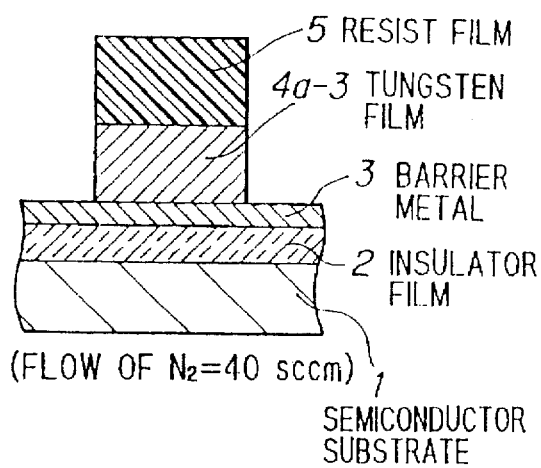
Figure 3D:
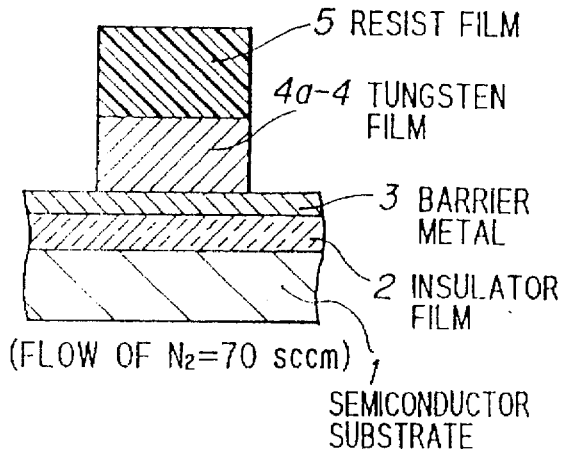

On referring to FIGS. 3A to 3D which represent typical forms of cross-sectional views of tungsten films 4a-1 to 4a-4, it can be seen that, when flow of $SF_6$ is 100 sccm and flow of $N_2$ is varied in arrange of 0–70 sccm in this embodiment, results of experiments can be summarized as follows. In a case of flow of $N_2$=0 sccm, a tungsten film 4a-1 is remained when a tungsten film 4a in FIG. 2 is sufficiently etched. As seen from FIG. 3A, a large side etching can be observed in side walls of a tungsten film 4a-1. In a case of flow of $N_2$=10 sccm, a situation is improved to some extents compared with a case of flow of $N_2$=0 sccm, however, traces of side etching still remain on side walls of a remained tungsten film 4a-2 as shown in FIG. 3B. In cases of $N_2$=40 sccm and 70 sccm, side walls 4a-3s and 4a-4s of remained tungsten films are nearly vertical as shown in FIG. 3C and FIG. 3D respectively. On above mentioned conditions, wire-conductors with desired cross-sectional views can be obtained if flow ratios are more than 25% after all. Moreover, when resist films 5s are removed by ashing by oxygen plasma after etching, there is no remaining resist film.

Figure 4:
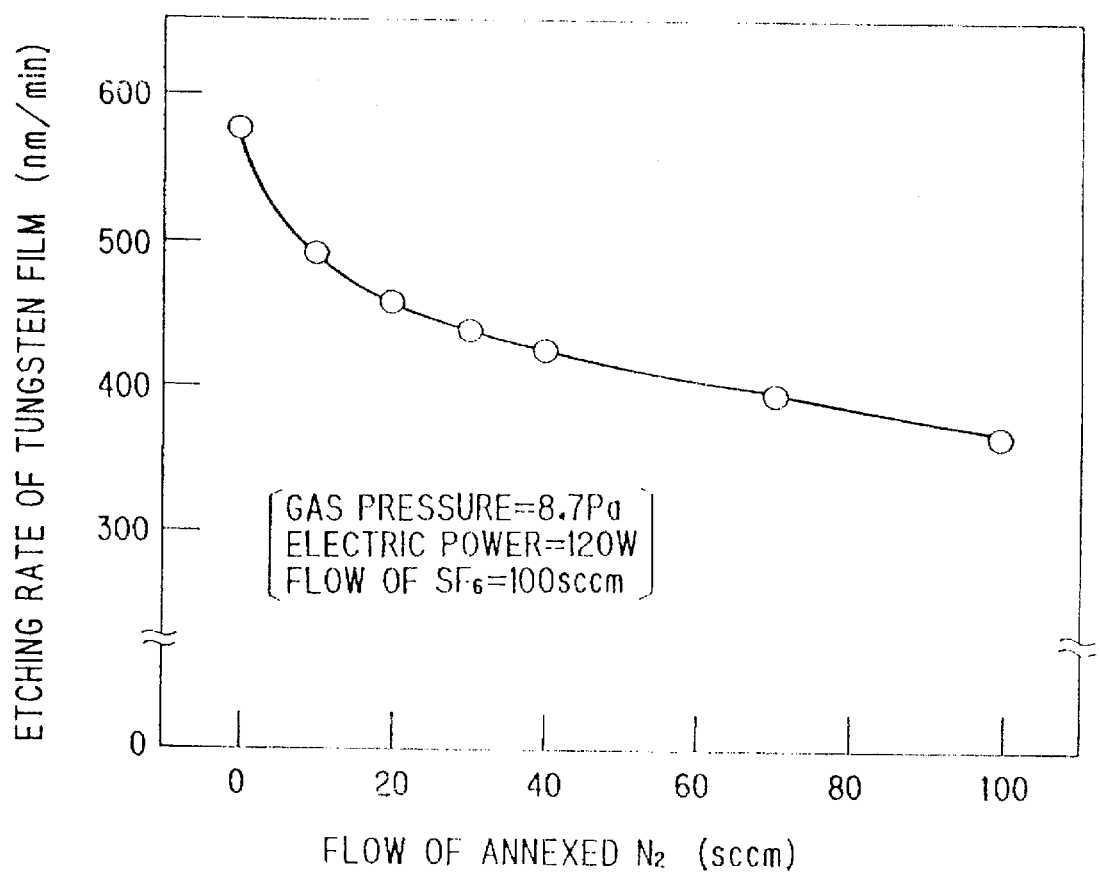
FIG. 4 is a graphical representation of an etching rate of a tungsten film for explaining first preferred embodiment of the invention.

FIG. 4 is a graphical representation showing a relation between etching rate of a tungsten film and flow of annexed $N_2$ on above mentioned condition of etching in experiments according to the first preferred embodiment. Etching rate decreases as flow of $N_2$ increases. These results arise, because quantity (thickness) of tungsten nitride film, which is product of reaction between nitric radicals and tungsten, increases as flow of $N_2$ increases, etching of tungsten is suppressed, and $N_2$ acts as dilution gas by itself.

In above mentioned examples, $N_2$ is used as an annexed gas, however, results with similar tendencies to those in cases of FIGS. 3A to 3D and FIG. 4 can be obtained, when ammonia gas is used as an annexed gas.

Figure 5A:
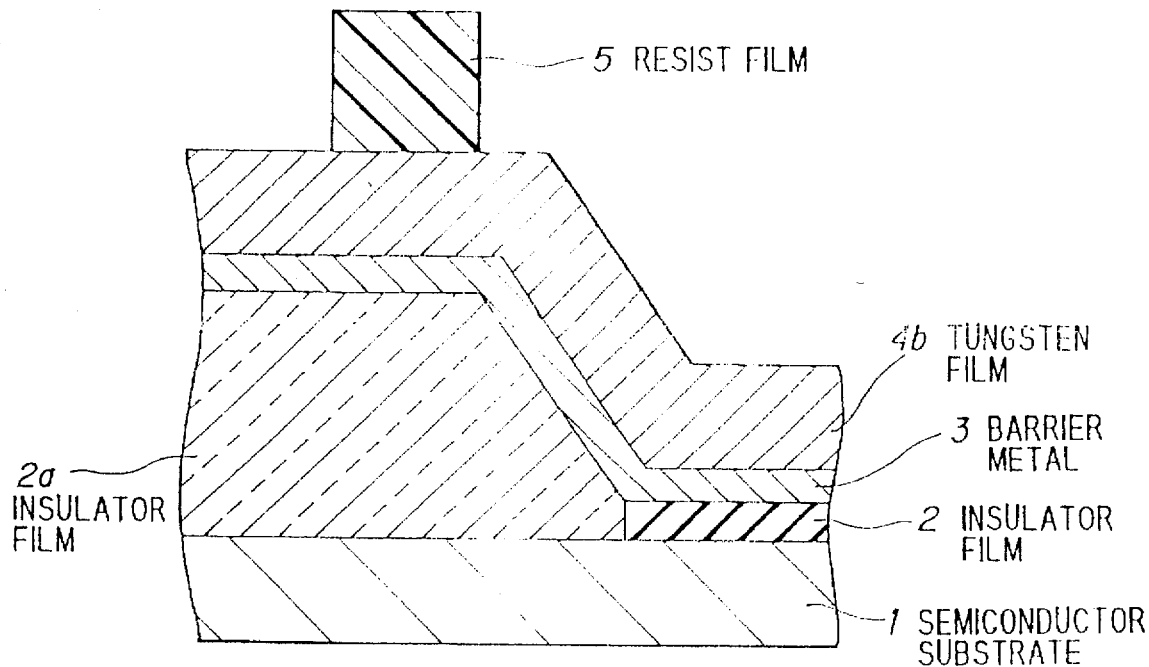
FIGS. 5A and 5B are cross-sectional views showing a manufacturing process of a semiconductor device of a second preferred embodiment of the invention.
Figure 5B:
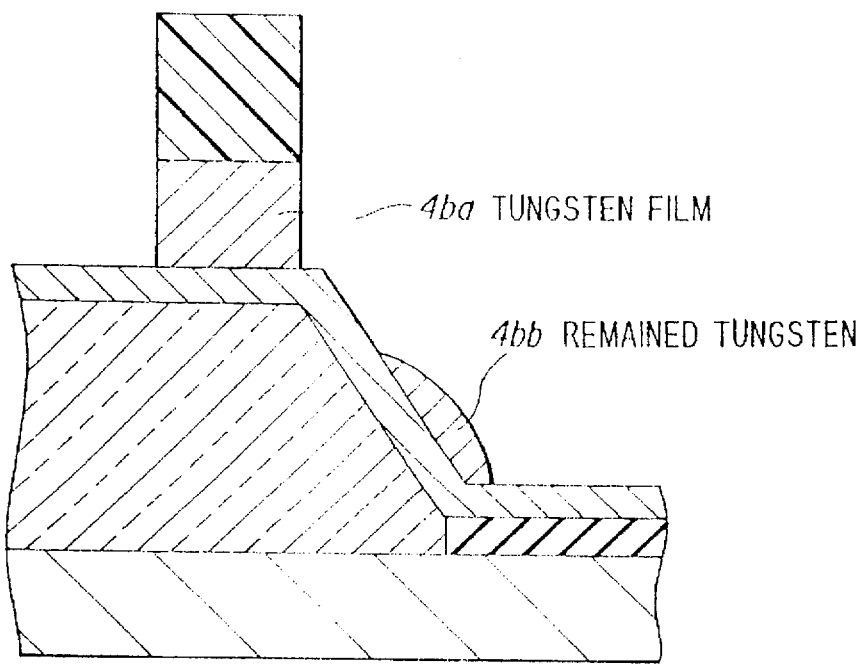

FIGS. 5A and 5B show cross-sectional views for explaining manufacturing process of semiconductor devices when insulator films have steps as the second preferred embodiment.

A surface of a semiconductor substrate 1 is covered with insulator films 2a and 2b which has thick and thin thicknesses respectively. On surfaces of these insulator films 2a and 2b, a barrier metal film 3 and a tungsten film 4b are deposited. For example, a resist film 5 with predetermined pattern is formed on a tungsten film 4b on an insulator film 2a as shown in FIGS. 5A and 5B.

Etching is progressed until a tungsten film 4ab with a pattern transformed from a resist film 5 is obtained, in other words just-etching is completed, on the condition that electric power=120 W, etching gas pressure=8.7 Pa, flow of $SF_6$=100 sccm, and flow of $N_2$=40 sccm for instance. In this case, a tungsten film 4bb still remains at a step portion of insulator films 2a and 2b as shown in FIG. 5B.

By progressing etching on the above mentioned condition furthermore, a tungsten film 4bb can be removed, however, required time is considerably long. To overcome this disadvantage, an over-etching according to this embodiment adopts a method to increase an etching rate of a tungsten film by increasing flow of $SF_6$ or decreasing flow of $N_2$, 40 sccm is decreased to 10 sccm for instance, in other words by increasing flow ratio of $SF_6$. A reason why such a method can be realized is that side walls of a tungsten film 4ba are protected by tungsten nitride films.

In aforementioned first and second embodiments of the invention, a tungsten film is used as a metal involving a high melting point metal as a main component, however, the invention is applicable to a case of a tungsten alloy film, a molybdenum film, a molybdenum alloy film, a tantalum film or a tantalum alloy film, and even to a case of a multi-layer film produced by a proper combination of above mentioned metal films, involving a tungsten film. Besides, $SF_6$ is adopted as a fluoride gas, however, a phloro-carbon gas, such as $CF_4$ or $CHF_3$ may be used.

As described in the above, according to a method for manufacturing of a semiconductor device, resist films can be easily removed and a wire with desired form of side walls, width, and wiring resistance can be easily formed by etching a metallic film involving a high melting point metal as a main component, by using a mixed gas involving a fluoride gas and nitrogen or ammonia gas.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method for manufacturing a semiconductor device comprising the steps of:

forming an insulator film on a semiconductor substrate, forming a barrier metal film on said insulator film, forming a tungsten film on said barrier metal film, forming a resist film with a pattern on said tungsten film, and selectively etching said tungsten film to expose said barrier metal film, by a mixed gas containing at least fluoride gas and nitrogen gas, using said resist film as a mask, a flow of said nitrogen gas being more than 25% of a flow of said fluoride gas.

* * * * *